US006189448B1

(12) United States Patent
O'Neal et al.

(10) Patent No.: US 6,189,448 B1
(45) Date of Patent: Feb. 20, 2001

(54) DUAL IMAGE STENCIL APPARATUS HAVING STENCIL INCLUDING SECTIONS WITH CURLED EDGES

(76) Inventors: Dennis O'Neal, 82 Bellingham Rd., Blackstone, MA (US) 01504; Dennis G. Doyle, 49 Richard Ave., Shrewsbury, MA (US) 01545

( * ) Notice: Under 35 U.S.C. 154(b), the term of this patent shall be extended for 0 days.

(21) Appl. No.: 09/186,718

(22) Filed: Nov. 5, 1998

Related U.S. Application Data

(60) Provisional application No. 60/064,938, filed on Nov. 7, 1997.

(51) Int. Cl.[7] ..................... B41F 15/36

(52) U.S. Cl. ..................... 101/127; 101/129; 101/128

(58) Field of Search ..................... 101/126, 127, 101/127.1, 128, 128.1, 128.21, 129

(56) References Cited

U.S. PATENT DOCUMENTS

| | | | | |
|---|---|---|---|---|
| 2,421,825 | * | 6/1947 | Aulick | 101/127 |
| 2,583,820 | * | 1/1952 | Dicks | 101/128.1 |
| 3,589,284 | * | 6/1971 | Harwell, Jr. | 101/127.1 |
| 4,268,545 | | 5/1981 | Hodulik | 101/127 |
| 4,649,635 | | 3/1987 | Asai et al. | 29/759 |
| 4,750,421 | * | 6/1988 | Lucas | 101/128 |
| 4,843,963 | * | 7/1989 | Hoeflein et al. | 101/128 |
| 4,946,021 | | 8/1990 | Murphy | 198/375 |
| 5,032,426 | | 7/1991 | Sumner, Jr. | 427/96 |
| 5,309,837 | | 5/1994 | Nanzai | 101/129 |
| 5,359,928 | | 11/1994 | Bessington et al. | 101/129 |
| 5,436,028 | | 7/1995 | Becher et al. | 427/96 |
| 5,483,884 | | 1/1996 | Vellanki | 101/129 |
| 5,669,970 | * | 9/1997 | Balog et al. | 101/127.1 |

FOREIGN PATENT DOCUMENTS

| | | |
|---|---|---|
| WO 93/25061 | 12/1993 | (WO) . |
| WO99/13695 | 3/1999 | (WO) . |

* cited by examiner

*Primary Examiner*—John S. Hilten
*Assistant Examiner*—Leslie J. Grohusky
(74) *Attorney, Agent, or Firm*—Mintz, Levin, Cohn, Ferris, Glovsky, and Popeo, P.C.

(57) ABSTRACT

A stencil for a printer used to print a substance onto a substrate using a blade that passes over the stencil during printing. In embodiments of the invention, the stencil includes a first section having a first printing pattern formed thereon, a second section having a second printing pattern formed thereon, a seam between the first section and the second section, and a strip that covers at least a portion of the seam to allow the blade to pass smoothly over the seam.

9 Claims, 6 Drawing Sheets

46
40
22
22
47
16
18
48
47
48
42
44
20
43
45
20

DUAL IMAGE STENCIL APPARATUS HAVING STENCIL INCLUDING SECTIONS WITH CURLED EDGES

RELATED APPLICATION

This application claims priority from U.S. Provisional Application Serial No. 60/064,938, filed Nov. 7, 1997, which is incorporated by reference herein.

FIELD OF THE INVENTION

The present invention relates generally to a stencil apparatus used in a stencil or screen printer and more specifically to a multiple image stencil apparatus used in a stencil printer for printing solder paste onto a circuit board or some other similar substrate.

BACKGROUND OF THE INVENTION

In typical surface-mount circuit board manufacturing operations, a stencil printer is used to print solder paste onto a circuit board. Typically, a circuit board having a pattern of pads or some other, usually conductive, surface onto which solder paste will be deposited is automatically fed into the stencil printer and one or more small holes or marks on the circuit board, called fiducials, is used to properly align the circuit board with the stencil or screen of the stencil printer. In some prior art systems, an optical alignment system is used to align the circuit board with the stencil. Examples of optical alignment systems for stencil printers are described in U.S. Pat. No. 5,060,063, issued Oct. 21, 1991 to Freeman, and in U.S. Pat. No. Re. 34,615, issued Jan. 31, 1992, also to Freeman, each of which is incorporated herein by reference.

Once the circuit board has been properly aligned with the stencil in the printer, the circuit board is raised to the stencil, solder paste is dispensed onto the stencil, and a wiper blade (or squeegee) traverses the stencil to force the solder paste through apertures in the stencil and onto the board. The stencil typically consists of a thin but relatively stiff sheet of stainless steel or brass in which fine lines or apertures for the passage of solder paste have been formed, for example, by etching or laser cutting.

More recently, the development of dual image and dual lane solder paste stencil printers has created the need for two aperture patterns on one stencil. In particular, U.S. patent application Ser. No. 08/802,934, entitled Dual Tracking Stencil/Screen Printer, incorporated herein by reference, discloses a stencil printer having dual lanes, each of which is designed to receive a circuit board to be printed upon with solder paste. In embodiments of the invention disclosed in U.S. patent application Ser. No. 08/802,934, one stencil having two aperture images or patterns (one for each lane of the printer) is used to print solder paste on circuit boards. The two images on the stencil may be the same, for example, when each of the lanes is used for circuit boards having the same configuration, or may be different to accommodate different circuit boards (i.e., different products) in each of the lanes. In some applications, one lane of the printer is used to print solder paste on the top of a circuit board and the other lane of the printer is used to print solder paste on the bottom of the circuit board. In this application, each of the patterns on the stencil is typically unique.

Stencils used in solder paste stencil printers are relatively expensive and therefore, it is desirable to replace the stencils as infrequently as possible. However, it is not uncommon for a schematic change to be made to a printed circuit board requiring replacement of the stencil used to print solder paste on the circuit board. For dual-image stencils, used, for example, to print on the top and bottom of a circuit board as discussed above, the frequency of schematic changes requiring replacement of the stencil will be significantly greater than in a single image stencil.

For applications in which a dual lane screen printer is simultaneously used in the production of two different products, so that the two images on the stencil are different, it is often desirable to replace one of the products with a different product, to meet production demands. In these applications, a unique stencil is typically provided for each of the possible product combinations, resulting in the need to purchase and store a large number of stencils.

Another drawback associated with prior art dual image stencils is that when one of the images on a stencil is damaged, the entire stencil must typically be replaced, even though the other image on the stencil is still fine for printing.

SUMMARY OF THE INVENTION

Embodiments of the present invention overcome drawbacks of the dual image stencils described above, by providing multiple image stencils in which one or more of the images on the stencil may be replaced.

BRIEF DESCRIPTION OF THE DRAWINGS

For a better understanding of the present invention, reference is made to the drawings which are incorporated herein by reference and in which.

DETAILED DESCRIPTION

For purposes of illustration, embodiments of the present invention will now be described with reference to a stencil printer used to print solder paste onto a circuit board. One skilled in the art will appreciate, however, that embodiments of the present invention are not limited to stencil printers that print solder paste onto circuit boards, but rather, may be used in other applications that utilize a stencil or a screen.

Figure 1:
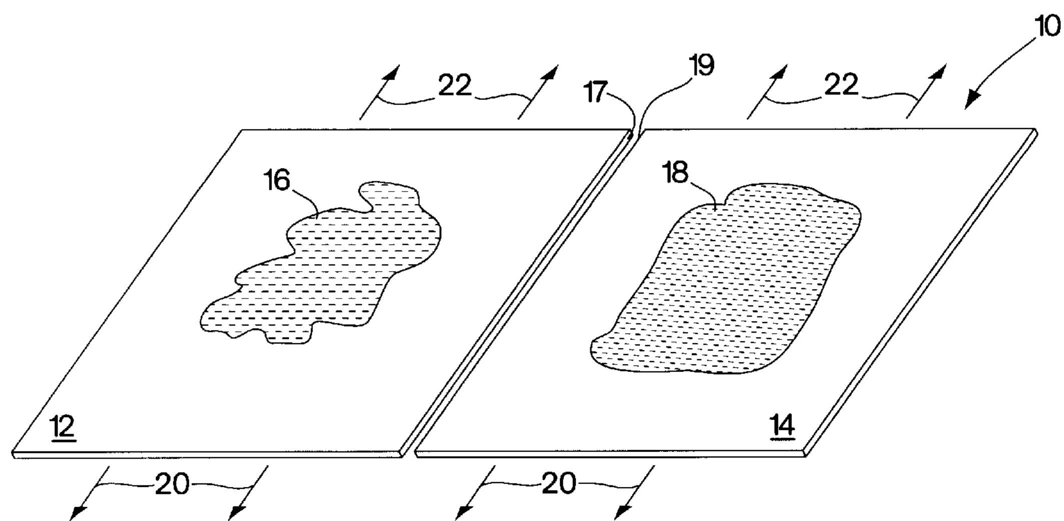
FIG. 1 shows a multiple image stencil in accordance with a first embodiment of the present invention.

FIG. 1 shows a multiple image stencil 10 in accordance with one embodiment of the present invention for use in a dual image or dual lane printer that prints solder paste onto a circuit board. The dual image stencil comprises a first stencil section 12 and a second stencil section 14, each having a respective aperture image 16 and 18. Each of the aperture images consists of a pattern of holes or lines formed, for example, by etching or laser cutting the stencil section. In one embodiment, each of the stencil sections is made from a thin sheet of stainless steel.

The stencil 10 is loaded into a frame for use in a stencil printer, so that one edge 17 of the first stencil section 12 is in contact with one edge 19 of the second stencil section. The frame may be an integral part of the stencil printer or may be separable from the stencil printer. Either the frame or the stencil printer is configured to hold the stencil sections 10 and 12 of the stencil in position during printing and to provide tension to the stencil 10 by applying pressure to the stencil in the direction of arrows 20 and 22. It is desirable to provide tension to the stencil to maintain the stencil in a rigid manner during printing. The stencil 10 may have one or more holes or slots (not shown) at the edges of the stencil to facilitate the application of pressure to the stencil by the frame or by the stencil printer. The first and second stencil sections could also be fastened in the stencil frame using bonded polyester mesh as is known in the art.

In one embodiment, the stencil sections 10 and 12 are loaded into a frame, and tension is applied to the stencil using one of several techniques known in the art, such as spring-loaded fasteners, or pneumatic, hydraulic or electrically driven fasteners. In other embodiments of the present invention, the stencil 10 is fastened using the stencil support apparatus disclosed in Published PCT Application No. PCT/GB93/01021, entitled Improved Stencil or Mask For Applying Solder to Circuit Boards and Support Frame Therefor, incorporated herein by reference.

Figure 2:
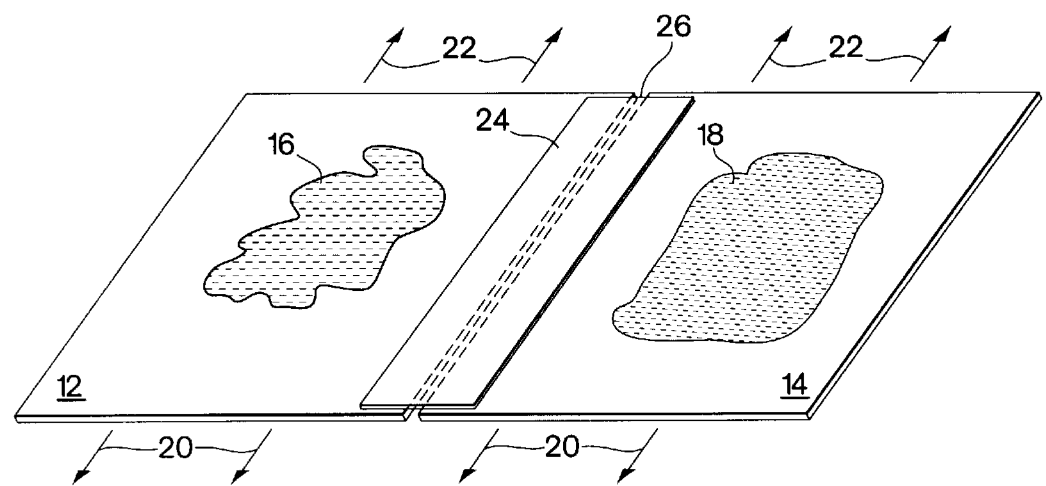
FIG. 2 shows an alternate version of the multiple image stencil shown in FIG. 1.

As shown in FIG. 2, a thin strip 24 may be placed over the seam 26 between the first stencil section 12 and the second stencil section 14 of the stencil 10. The thin strip 24 is used to cover the seam to prevent solder paste from penetrating through the seam and to provide a smooth transition for the squeegee of the stencil printer as it passes over the seam. The thin strip 24 may be implemented using adhesive backed tape or a thin strip of metal, plastic or some other material held in place using an adhesive, a clip or some other fastening device.

Figure 3:
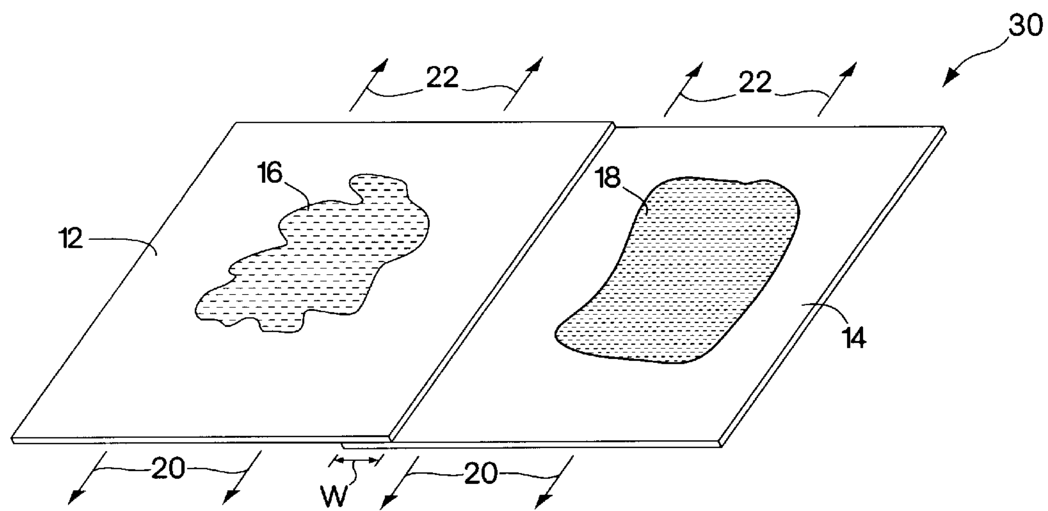
FIG. 3 shows a multiple image stencil in accordance with a second embodiment of the present invention.

FIG. 3 shows another embodiment of a multiple image stencil 30 for use in a dual image or dual lane printer. The multiple image stencil 30 is comprised of the same first and second stencil sections 12 and 14 as the dual image stencil 10 discussed above with reference to FIG. 1. Multiple image stencil 30 differs from multiple image stencil 10 in that the first stencil section 12 overlaps the second stencil section 14 to prevent a continuous vertical seam through which solder paste can penetrate. In one embodiment, the width of the overlapped area W is approximately 0.50 inches.

The multiple image stencil 30 is mounted in a stencil printer using one of the same techniques discussed above for the stencil 10. As with stencil 10 discussed above, when the stencil 30 is mounted in a screen printer, tension is provided to the stencil in the directions shown by arrows 20 and 22.

Figure 4:
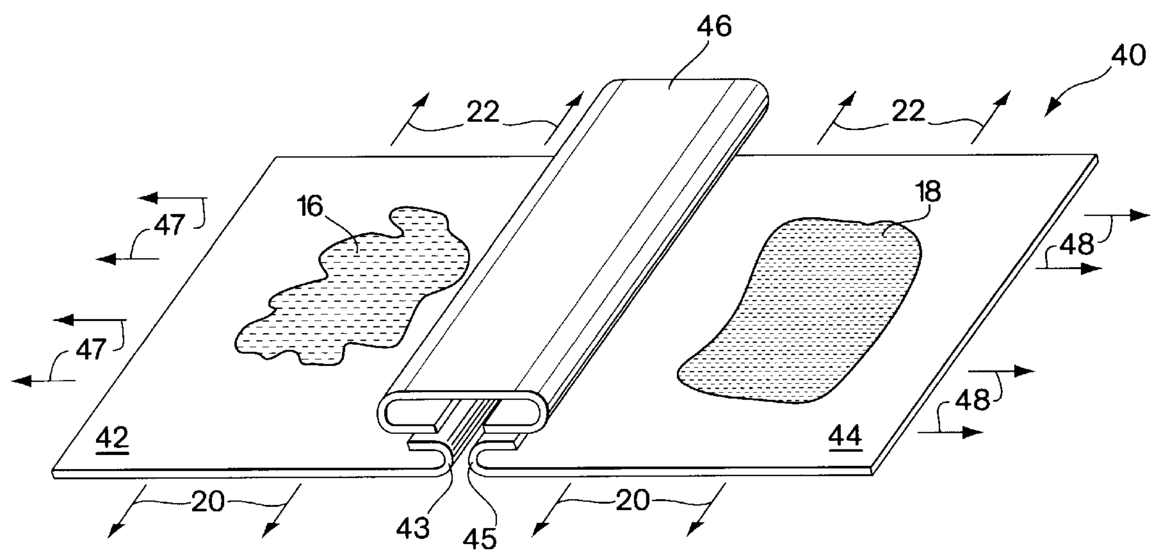
FIG. 4 shows a multiple image stencil in accordance with a third embodiment of the present invention.
Figure 5:
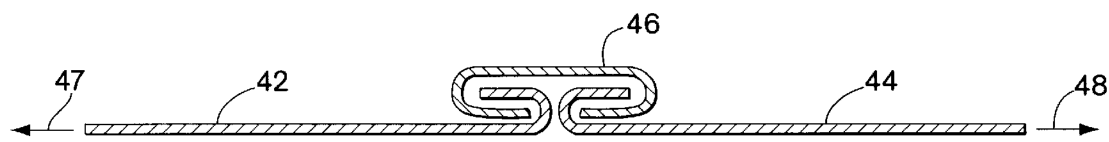
FIG. 5 shows a side view of the multiple image stencil shown in FIG. 4.

FIG. 4 shows another embodiment of a multiple image stencil 40 for use in a dual image or dual lane printer. The multiple image stencil 40 is comprised of a first stencil section 42 and a second stencil section 44 that are similar to stencil sections 12 and 14, except that stencil sections 42 and 44 have curled edges 43 and 45 respectively. The multiple image stencil 40 also includes a "C" clip 46 that is used to hold the stencil sections 42 and 44 together as shown in FIG. 5 without a continuous seam through which solder paste can penetrate.

In one embodiment, the "C" clip is constructed from a resilient material, and the clip is installed by bending the clip and placing it over the curled edges of each of the stencil sections. In another embodiment, the clip is installed by sliding it over the curled edges of the stencil sections.

The multiple image stencil 40 is mounted in a screen printer using one of the same techniques discussed above for the stencil 10. The mounting of stencil 40 differs from the mounting of stencil 10 in that, when the stencil 40 is mounted in a screen printer, tension is provided to the stencil by applying pressure to the stencil in the directions shown by arrows 20 and 22 and in the directions shown by arrows 47 and 48.

Figure 6:
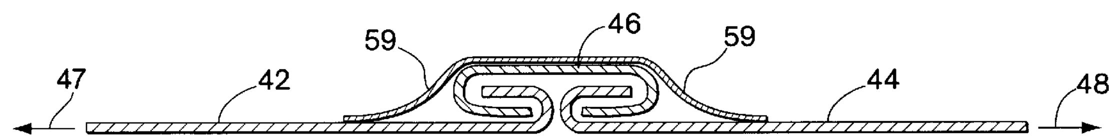
FIG. 6 shows a first alternate version of the multiple image stencil shown in FIG. 4.

As shown in FIG. 6, the "C" clip may be covered with a piece of self-adhesive tape 59 to provide a smooth transition for the squeegee of the stencil printer as it passes over the "C" clip. In other embodiments, in place of the tape 59, a metal or plastic strip may be attached to the "C" clip to provide the smooth transition.

Figure 7:
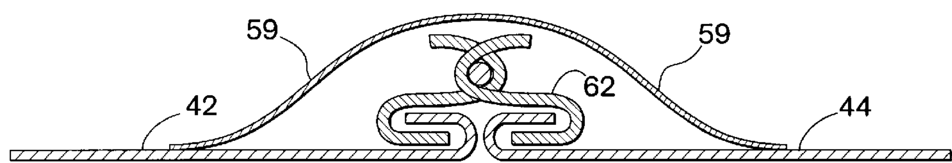
FIG. 7 shows a second alternate version of the multiple image stencil shown in FIG. 4.
Figure 8:
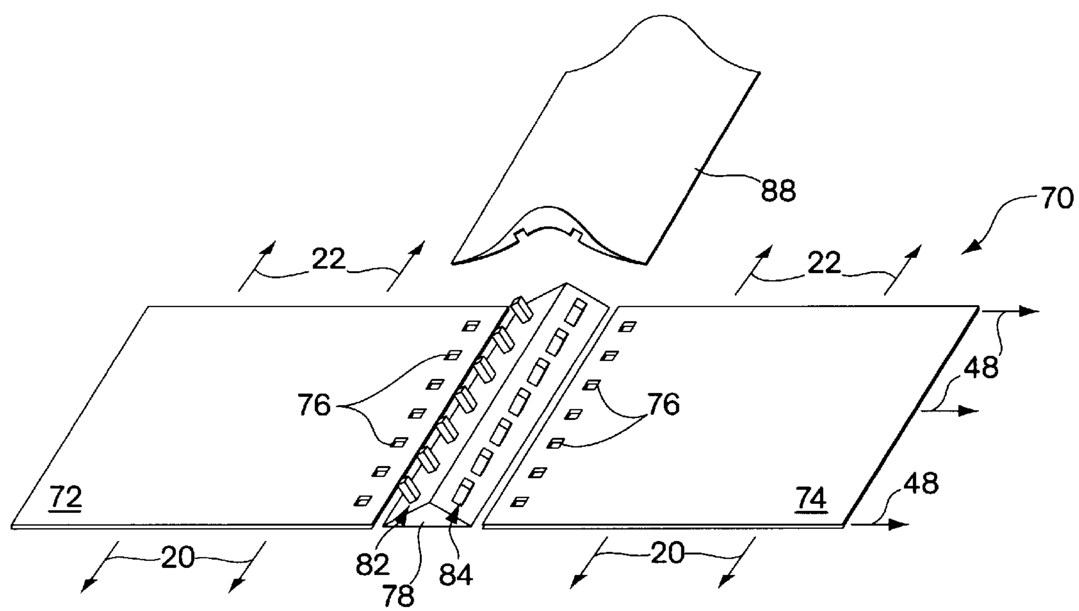
FIG. 8 shows a multiple image stencil in accordance with a fourth embodiment of the present invention.
Figure 9:
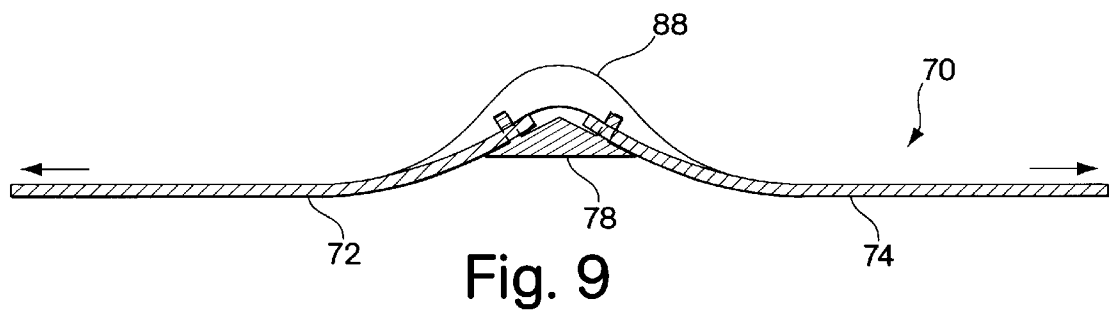
FIG. 9 shows a side view of the multiple image stencil shown in FIG. 8.
Figure 10:
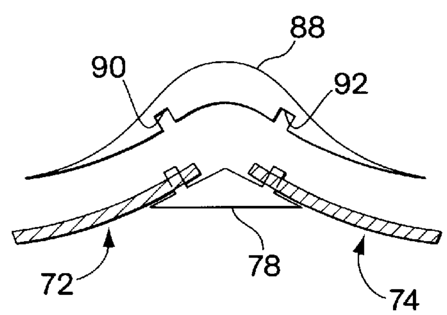
FIGS. 10 and 11 show a cap used in the embodiment of FIG. 8 in greater detail.
Figure 11:
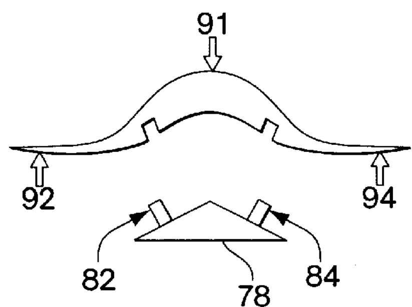
Figure 12:
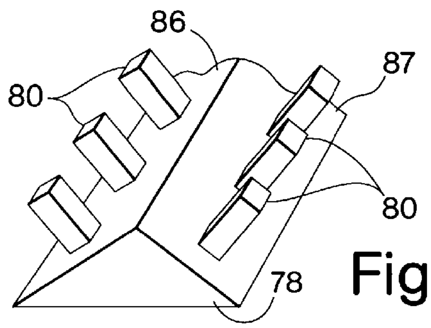
FIG. 12 shows a retaining bar used in the embodiment of FIG. 8 in greater detail.

In another version of the embodiment shown in FIGS. 4–6, the "C" clip is replaced by a spring-loaded clip 62, as shown in FIG. 7. Similar to the "C" clip, the spring-loaded clip 62 may be covered by a piece of tape 59 or a metal or plastic strip.

FIGS. 8–12 show another embodiment of a multiple image stencil 70 for use in a dual image or dual lane printer. The multiple image stencil 70 is comprised of a first stencil section 72 and a second stencil section 74 that are similar to stencil sections 12 and 14, except that stencil sections 72 and 74 each have a number of square perforations 76 arranged in a line along one edge of the stencil section. A retaining bar 78, having a triangular cross section and a number of holding pins 80, is used to hold the stencil sections 72 and 74 together. The holding pins are arranged in a first row 82 and a second row 84 respectively on a first face 86 and a second face 87 of the retaining bar. As shown in greater detail in FIG. 12, the holding pins 80 have a square cross-section to mate with the perforations 76.

A cap 88 is used to cover the retaining bar 78 to provide a smooth transition for the squeegee as it passes from one stencil section to the other. The cap 88 has a first groove 90 and a second groove 92 to mate respectively with the first row 82 and the second row 84 of holding pins. The cap 88 is made from a resilient material such as stainless steel which allows the cap to be deflected when placed on and removed from the retaining bar 78. To place the cap 88 onto the bar, or to remove it from the bar, force is provided to the cap at the positions shown by arrows 91, 92 and 94 in FIG. 11. When the cap is mounted to the retaining bar 78, it is in a deflected state, and the spring tension of the cap holds it securely in place on the retaining bar. Although the perforations and the holding pins are shown as square, they could also be circular or of some other shape. The dual image stencil 70 is mounted in a stencil printer using one of the same techniques discussed above for stencils 10 and 40.

Figure 13:
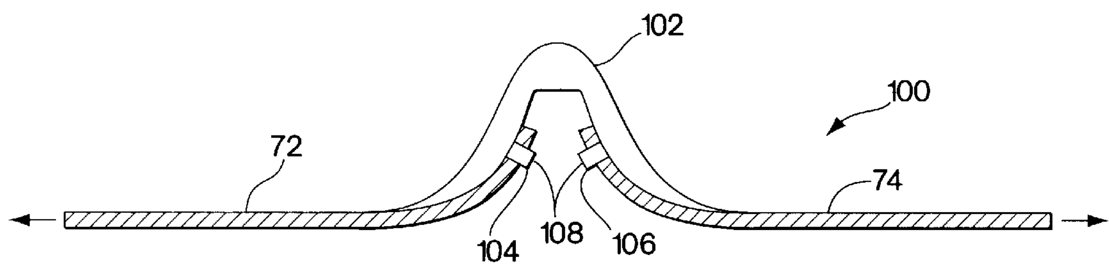
FIG. 13 shows a multiple image stencil in accordance with a fifth embodiment of the present invention.
Figure 14:
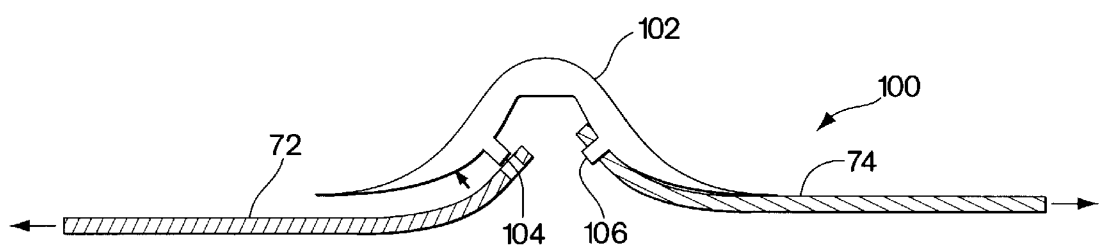
FIG. 14 shows placement of a cap in the embodiment shown in FIG. 13.

FIGS. 13 and 14 show another embodiment of a multiple image stencil 100 for use in a dual image or dual lane printer. The multiple image stencil 100 includes the first stencil section 72 and the second stencil section 74 of the stencil 70 described above, and also includes a cap 102. The cap 102 is similar to the cap 88 except that the grooves in the cap 88 are replaced by a first row 104 and a second row 106 of pins 108. The stencil 100 differs from stencil 70 in that the retaining bar is not used in stencil 100, but rather, the pins in the cap 102 are used to hold the first and second stencil sections together. As with the cap 88, spring tension is used to hold cap 102 in place and to lock the first and second stencil sections onto the pins 108.

Figure 15:
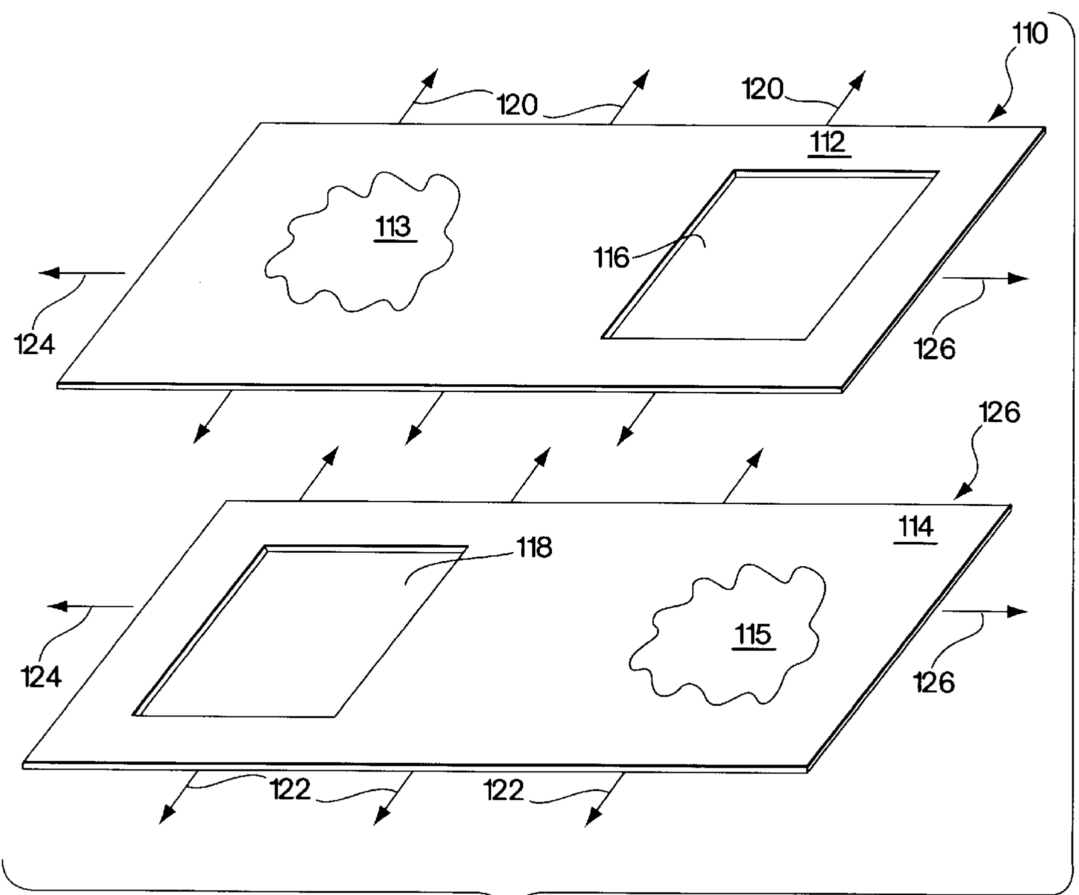
FIGS. 15 and 16 show a multiple image stencil in accordance with a sixth embodiment of the present invention.
Figure 16:
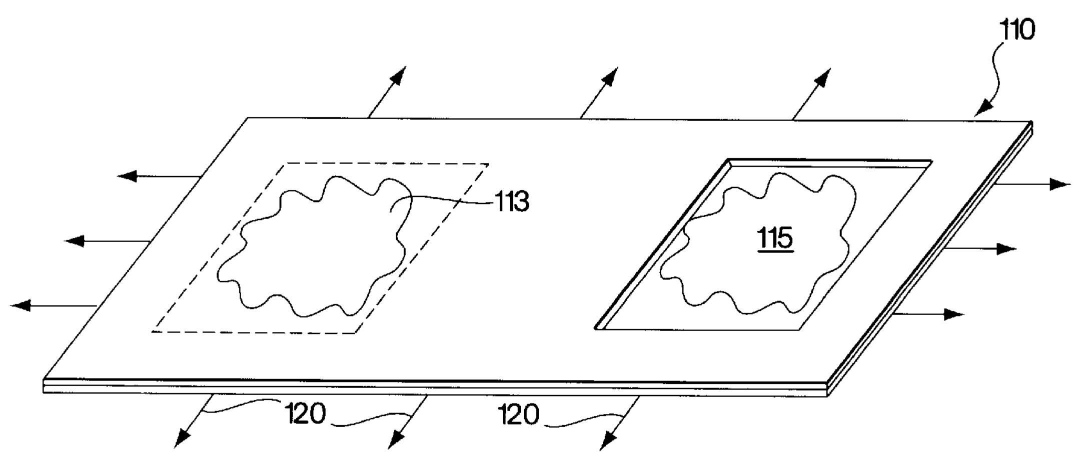

FIGS. 15 and 16 show another embodiment of a multiple image stencil 110 for use in a dual image or dual lane printer. The multiple image stencil 110 includes a first stencil section 112 and a second stencil section 114. In contrast with the previously described embodiments of the present invention, the first and second stencil sections are not arranged side-by-side, but rather, are placed one on top of the other. Specifically, in the embodiment shown in FIGS. 15 and 16, the first stencil section 112 is placed on top of the second stencil section 114. Each of the stencil sections 112 and 114 have a respective aperture image 113 and 115, similar to the aperture images of the embodiments discussed above. In addition, each of the stencil sections has a rectangular cut-out 116 and 118 having an area that is larger than the areas of the aperture images As shown in FIG. 16, the aperture images and the cut-outs are arranged such that the cut-out of each stencil section is aligned with the aperture image of the other stencil section when the stencil sections are arranged with one on top of the other. The stencil 110 may be secured in a stencil printer with or without a frame in the same manner as the stencils described above. The stencil 110 is designed to receive tension in the directions shown by arrows 120, 122, 124 and 126.

Using the stencil 110, two different images may be printed on one circuit board in a dual image printer, or one image can be printed on two different circuit boards. Tape, or a similar material, could be placed at the interface between the cut-out of the first stencil section and the second stencil section to provide a smooth transition for the squeegee as it passes from the first stencil section to the second stencil section.

Several embodiments of dual image stencils for use in dual image or dual lane stencil printers have been described above. As understood by those skilled in the art, the present invention is not limited to stencils having two images, but rather, the embodiments described above, can be readily adapted to accommodate a number of images greater than two by, for example, utilizing a number of stencil sections greater than two.

Embodiments of the present invention overcome the drawbacks discussed above with prior art dual image stencils by providing multiple image stencils in which aperture images may readily be replaced. Thus, embodiments of the present invention allow only one image to be replaced when it has been damaged, when the corresponding circuit board has had a schematic design change, when manufacturing demand changes, or for any other reasons.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting.

What is claimed is:

1. A stencil for a printer used to print a substance onto a substrate using a blade that passes over the stencil during printing, the stencil comprising:

a first section having a first printing pattern formed thereon and having a first curled edge;

a second section having a second printing pattern formed thereon and having a first curled edge;

wherein the first curled edge of the first section is aligned with the first curled edge of the second section; and means to join and fasten the first curled edge of the first section with the first curled edge of the second section.

2. The stencil printer of claim 1, wherein the first printing pattern is the same as the second printing pattern.

3. The stencil of claim 1, wherein the means to join and fasten the first section and the second section is a fastener having a cross-section in the shape of a "C" and disposed over the first curled edge of the first section and the first curled edge of the second section.

4. The stencil of claim 3, wherein the fastener is spring-loaded.

5. The stencil of claim 3, further comprising a strip that covers a length of the fastener to provide a smooth transition between the first section and the second section.

6. A method of loading a stencil into a stencil printer comprising steps of:

providing a first stencil section having a first printing pattern disposed thereon and having a first curled edge;

providing a second stencil section having a second printing pattern disposed thereon and having a first curled edge;

loading the first stencil section and the second stencil section in the printer such that the first curled edge of the first section is aligned with the first curled edge of the second section; and fastening the first section to the second section using a fastening device disposed over the first curled edge of the first section and the first curled edge of the second section to join and fasten the curled edges.

7. The method of claim 6, further comprising steps of applying tension to the stencil sections in a direction parallel to a length of the fastening device, and applying tension to the stencil sections in a direction perpendicular to the length of the fastening device.

8. The method of claim 7, further comprising a step of placing a strip over the fastening device to provide a smooth transition between the first section and the second section.

9. The method of claim 6, wherein a seam is formed between the first pattern and the second pattern, and further comprising a step of placing a strip over the seam.

* * * * *